(12) United States Patent
Groeneveld et al.

(10) Patent No.: US 8,908,144 B2
(45) Date of Patent: Dec. 9, 2014

(54) LITHOGRAPHIC APPARATUS AND DEVICE MANUFACTURING METHOD

(75) Inventors: Rogier Herman Mathijs Groeneveld, Eindhoven (NL); Antonius Johannes Josephus Van Dijsseldonk, Hapert (NL); Dominicus Jacobus Petrus Adrianus Franken, Veldhoven (NL); Bastiaan Stephanus Hendricus Jansen, Waalre (NL); Robertus Johannes Marinus De Jongh, Eindhoven (NL); Marc Wilhelmus Maria Van Der Wijst, Veldhoven (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1244 days.

(21) Appl. No.: 11/527,729

(22) Filed: Sep. 27, 2006

(65) Prior Publication Data

US 2008/0074629 A1    Mar. 27, 2008

(51) Int. Cl.
*G03B 27/42*    (2006.01)
*G03F 7/20*    (2006.01)

(52) U.S. Cl.
CPC ............ *G03F 7/709* (2013.01); *G03F 7/70833* (2013.01)
USPC .................................. 355/53; 355/72; 355/77

(58) Field of Classification Search
CPC ... G03F 7/20; G03F 7/70775; G03F 7/70758; G03F 7/70716; G03F 7/707; G03F 7/70258; G03F 1/64; G03F 7/70766; G03F 7/70833; G03F 7/709; G03F 7/70816
USPC ................................. 355/53, 72, 77
See application file for complete search history.

(56) References Cited

U.S. PATENT DOCUMENTS 4,383,757 A    5/1983    Phillips
5,801,832 A    9/1998    Van Den Brink
(Continued)

FOREIGN PATENT DOCUMENTS

EP    1 380 899 A2    1/2004
EP    1 950 793 A1    7/2008
(Continued)

OTHER PUBLICATIONS

International Search Report for Appln. No. PCT/NL2007/000239 mailed Dec. 17, 2007, 2pgs.
(Continued)

*Primary Examiner* — Mesfin T Asfaw
(74) *Attorney, Agent, or Firm* — Sterne, Kessler, Goldstein & Fox P.L.L.C.

(57) ABSTRACT

A lithographic apparatus is disclosed that includes a support constructed to support a patterning device, the patterning device being capable of imparting a radiation beam with a pattern in its cross-section to form a patterned radiation beam and a substrate table constructed to hold a substrate. Further, the lithographic apparatus includes a projection system configured to project the patterned radiation beam onto a target portion of the substrate, the projection system being mounted to a reference element of the lithographic apparatus by a resilient mount to reduce a transfer of high frequency vibration from the reference element to the projection system and a control system to counteract a position error of the substrate table and the support relative to the projection system.

11 Claims, 5 Drawing Sheets

(56) References Cited

U.S. PATENT DOCUMENTS

| | | |
|---|---|---|
| 5,953,105 A | 9/1999 | Van Engelen et al. |
| 6,020,964 A | 2/2000 | Loopstra et al. |
| 6,038,013 A | 3/2000 | Ohsaki |
| 6,046,792 A | 4/2000 | Van Der Werf et al. |
| 6,122,058 A | 9/2000 | Van Der Werf et al. |
| 6,208,407 B1 | 3/2001 | Loopstra |
| 6,322,060 B1 * | 11/2001 | Mayama et al. ............ 267/136 |
| 6,359,688 B2 | 3/2002 | Akimoto et al. |
| 6,441,884 B1 | 8/2002 | Takahashi et al. |
| 6,522,388 B1 | 2/2003 | Takahashi et al. |
| 6,538,720 B2 | 3/2003 | Galburt et al. |
| 6,549,270 B1 | 4/2003 | Ota |
| 6,590,639 B1 | 7/2003 | Yuan et al. |
| 6,750,949 B2 | 6/2004 | Loopstra et al. |
| 6,788,386 B2 | 9/2004 | Cox et al. |
| 6,819,400 B2 | 11/2004 | Ravensbergen |
| 6,879,375 B1 | 4/2005 | Kayama |
| 6,977,713 B2 | 12/2005 | Luttikhuis et al. |
| 7,049,592 B2 | 5/2006 | Franken et al. |
| 7,936,443 B2 | 5/2011 | Butler et al. |
| 8,072,700 B2 | 12/2011 | Kwan et al. |
| 2002/0001082 A1* | 1/2002 | Akimoto et al. ............ 356/400 |
| 2002/0080339 A1* | 6/2002 | Takahashi .................. 355/72 |
| 2002/0149754 A1 | 10/2002 | Auer et al. |
| 2003/0053035 A1 | 3/2003 | Butler et al. |
| 2003/0117596 A1 | 6/2003 | Nishi |
| 2003/0117600 A1 | 6/2003 | Taniuchi et al. |
| 2003/0197914 A1 | 10/2003 | Cox et al. |
| 2004/0000215 A1 | 1/2004 | Phillips et al. |
| 2004/0178354 A1 | 9/2004 | Visscher |
| 2004/0257549 A1 | 12/2004 | Leenders et al. |
| 2005/0083500 A1 | 4/2005 | Franken |
| 2005/0140946 A1* | 6/2005 | Tsuji et al. ................. 355/30 |
| 2005/0140950 A1 | 6/2005 | Franken et al. |
| 2006/0139613 A1* | 6/2006 | Houkes et al. ............. 355/72 |
| 2007/0097367 A1 | 5/2007 | Sakamoto |
| 2007/0263189 A1 | 11/2007 | Butler et al. |
| 2011/0171759 A1 | 7/2011 | Butler et al. |

FOREIGN PATENT DOCUMENTS

| | | | |
|---|---|---|---|
| GB | 2299867 A | | 10/1996 |
| JP | 8-288198 A | | 11/1996 |
| JP | 09-283415 A | | 10/1997 |
| JP | 11-307448 A | | 11/1999 |
| JP | 2000-286189 A | | 10/2000 |
| JP | 2001-102286 A | | 4/2001 |
| JP | 2002-151379 A | | 5/2002 |
| JP | 2002-198285 A | | 7/2002 |
| JP | 2002-198286 A | | 7/2002 |
| JP | 2002198280 A | * | 7/2002 |
| JP | 2005-079373 A | | 3/2005 |
| JP | 2007-515773 A | | 6/2007 |
| WO | WO 2007/040254 A1 | | 4/2007 |

OTHER PUBLICATIONS

Non-Final Rejection mailed Aug. 19, 2008 to U.S. Appl. No. 11/430,181, filed Mar. 9, 2006.
Final Rejection mailed Jan. 13, 2009 to U.S. Appl. No. 11/430,181, filed Mar. 9, 2006.
Non-Final Rejection mailed Jun. 23, 2009, for U.S. Appl. No. 11/430,181, 8 pgs.
Non-Final Rejection mailed Jul. 19, 2010 for U.S. Appl. No. 11/430,181, 8 pgs.
Preliminary Report on Patentability and Written Opinion of the International Searching Authority directed to related International Patent Application No. PCT/NL2007/000239, issued Mar. 31, 2009; 6 pages.
Non-Final Rejection mailed Jan. 4, 2010 for U.S. Appl. No. 11/430,181, filed May 9, 2006; 8 pages.
Notice of Allowance mailed Dec. 23, 2010 for U.S. Appl. No. 11/430,181, filed May 9, 2006; 9 pages.
Non-Final Rejection mailed Apr. 9, 2013 for U.S. Appl. No. 13/052,190, filed Mar. 21, 2011; 7 pages.
Final Rejection mailed Sep. 6, 2013 for U.S. Appl. No. 13/052,190, filed Mar. 21, 2011; 7 pages.
Non-Final Rejection mailed Feb. 10, 2014 for U.S. Appl. No. 13/052,190, filed Mar. 21, 2011; 7 pages.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In current lithographic apparatuses, commonly refractive optics comprising, e.g., a projection lens are used to project a patterned beam onto the substrate. Present developments tend to a reduction of wavelength to achieve a higher resolution and smaller line widths of the patterns to be projected onto the substrate. In the last years, many developments have taken place to construct a lithographic apparatus making use of radiation in the extreme UV (EUV) wavelength range, e.g. making use of 13.5 nm wavelength. At such a wavelength, instead of refractive optics, reflective optics comprising, e.g., projection mirrors are used, as common refractive lenses tend to absorb a significant portion of EUV radiation.

A projection system using reflective optics can pose different design constraints on the lithographic apparatus. As an example, reflective optics are significantly less tolerant to disturbance by vibrations, as compared to refractive optics. This is because a displacement of a mirror in a reflective projection system will have, in general, a larger effect on image quality and accuracy, than a displacement of a lens in a refractive projection system. Such displacement may result in a displacement of the image on a surface of the substrate, a focus error or any other projection error.

SUMMARY

In an attempt to counteract effects of such sensitivity, various solutions have been proposed. For example, one or more of the mirrors in the reflective projection system may be provided with a stabilization mechanism comprising a sensor to sense an acceleration (thereby providing a measure of a force to which the mirror in question is subjected), and a controller to derive an actuator drive signal therefrom, the actuator drive signal being used to drive an actuator to actuate a force onto the mirror in question.

The reflective projection system may be mounted to a metrology frame of the lithographic apparatus by a soft mount, which provides for a reduction of vibrations to which the metrology frame is subjected, such vibration may be caused by, e.g., a flow of a coolant. Although such a soft mount provides for a reduction of higher frequency vibrations, i.e. vibrations above a cut-off frequency (e.g. several tens of Hertz) of the soft mount, low frequency movements of the projection system relative to the metrology frame may not be decreased due to the soft mount. Furthermore, in a frequency band around the cut-off frequency, an increase of transfer of vibrations may occur.

It is desirable, for example, to provide a reduction of the sensitivity of the lithographic apparatus against vibrations or other disturbances of the projection system, which vibrations or disturbances possibly adversely affecting projection of a pattern onto the substrate.

According to an aspect of the invention, there is provided a lithographic apparatus, comprising:

a support constructed to support a patterning device, the patterning device being capable of imparting a radiation beam with a pattern in its cross-section to form a patterned radiation beam;

a substrate table constructed to hold a substrate;

a projection system configured to project the patterned radiation beam onto a target portion of the substrate, the projection system being mounted to a reference element of the lithographic apparatus by a resilient mount to reduce a transfer of high frequency vibration from the reference element to the projection system; and a control system to counteract a position error of the substrate table and the support relative to the projection system.

According to an embodiment of the invention, there is provided a device manufacturing method, comprising:

supporting a patterning device by a support, the patterning device being capable of imparting a radiation beam with a pattern in its cross-section to form a patterned radiation beam;

holding a substrate by a substrate table;

projecting the patterned radiation beam onto a target portion of the substrate using a projection system, the projection system mounted to a reference element by a resilient mount to reduce a transfer of high frequency vibration of the reference element to the projection system;

counteracting a position error of the substrate table and the support relative to the projection system;

developing the irradiated substrate; and manufacturing a device from the developed substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
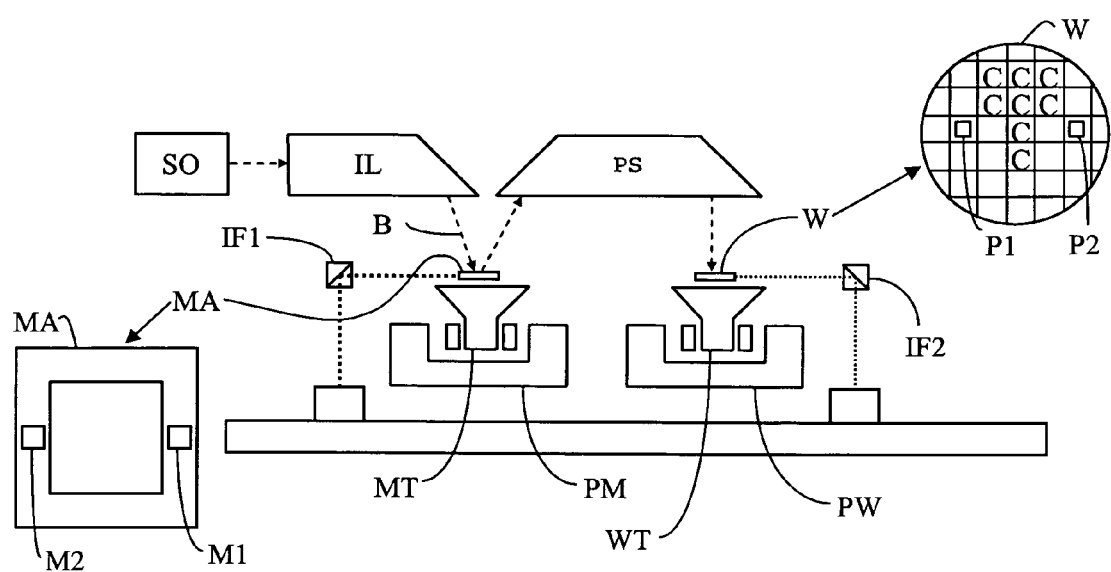
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters (in this document, the support structure may be referred to as a support);

a substrate table (e.g. a wafer table) WT constructed to hold a substrate (e.g. a resist-coated wafer) W and connected to a second positioner PW configured to accurately position the substrate in accordance with certain parameters; and a projection system (e.g. a reflective or refractive projection lens system) PS configured to project a pattern imparted to the radiation beam B by the patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables (and/or support structures) may be used in parallel, or preparatory steps may be carried out on one or more tables (and/or support structures) while one or more other tables (and/or support structures) are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
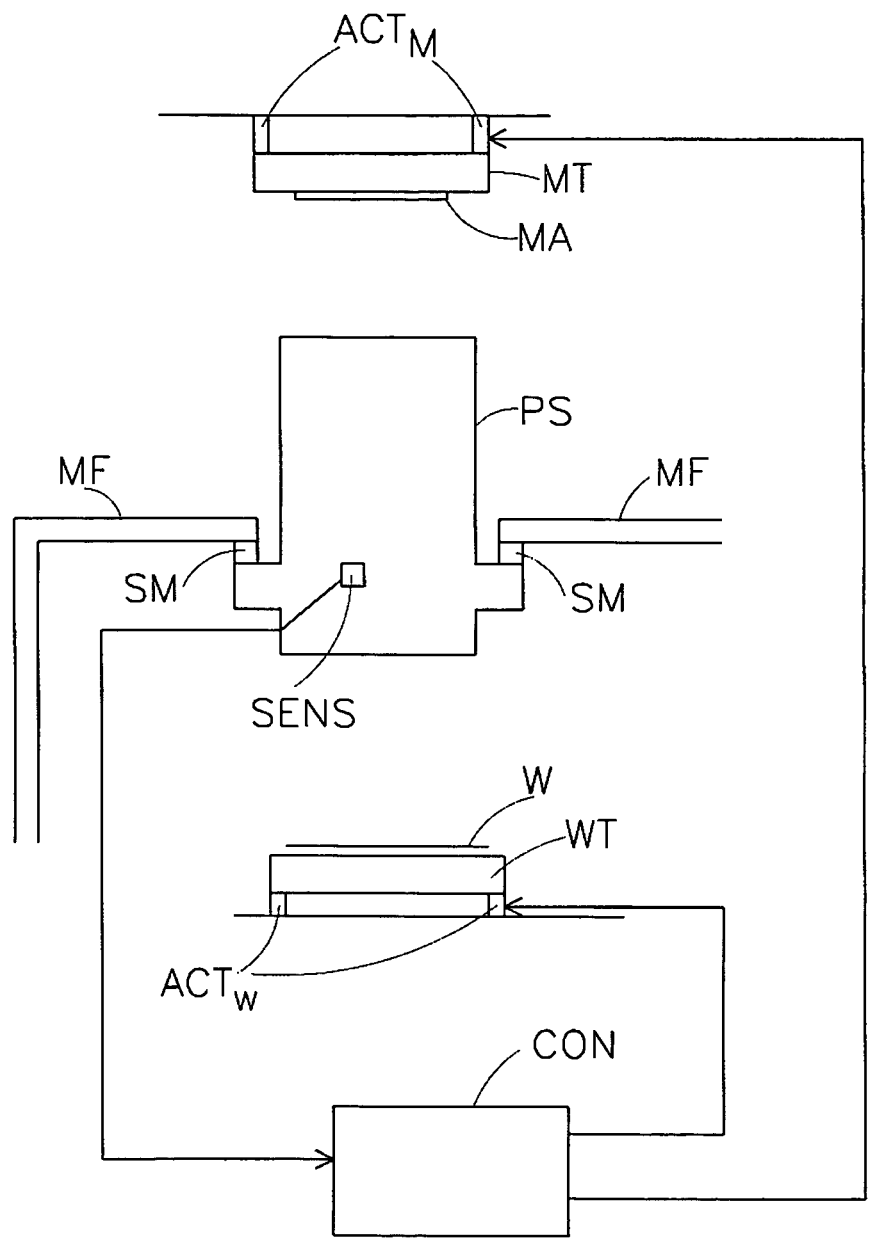
FIG. 2 depicts a schematic view of a part of a lithographic apparatus according to an embodiment of the invention.

FIG. 2 shows a projection system PS, in this example a so called projection optics box, comprising a plurality of mirrors to project the patterned beam arriving from the patterning device MA held by support MT (e.g. a mask table) onto the substrate W held by substrate stage WT. The projection system is connected via a resilient mount SM (further referred to as a soft mount) to the metrology frame MF which provides a reference in the lithographic apparatus. Further, FIG. 2 shows the substrate stage WT holding a substrate W and support MT holding a pattering device MA. The soft mount SM provides for a reduction of a transfer of vibrations of the metrology frame MF towards the projection system PS, thus at least partly preventing the projection system PS to be subjected to such vibrations. The soft mount SM may comprise any construction that provides a vibration reduction, comprising a resilient or flexible material, hydraulic vibration reduction system, a pneumatic vibration reduction system, or an active vibration reduction system comprising a suitable sensor and actuator. Causes of vibration may be numerous: as an example, a flow of a coolant in ducts of the metrology frame, movements of other parts of the lithographic apparatus, etc.

Further stabilization may be provided by an active stabilization control for one or more of the mirrors of the projection system. As an example, for each mirror, an acceleration sensor may be provided on or in the projection system, and a controller may derive a force signal from an acceleration signal. The force signal is, e.g., fed to an actuator of the respective mirror. The actuator, driven by the force signal, provides a force onto the respective mirror, which force makes the mirror at least partly follow the projection system. Thus, the acceleration sensor, controller and actuator may form a feed-forward control to stabilize the respective mirror. Other ways of stabilization are possible too, e.g. making use of a mirror position sensor and a feedback controller, etc. An effect of the stabilization is that the mirror will (in a certain frequency band) follow a vibration or other movement of the projection system as good as possible.

Despite the soft mount, the projection system may still in practice be subjected to mechanical vibrations. On the one hand, the soft mount provides for a reduction of a transfer towards the projection system of high frequency vibrations, i.e. vibrations at frequencies above a cut-off frequency of the soft mount. On the other hand, the use of a soft mount to mount the projection system to the metrology frame may not decrease a movement of the projection system in a low frequency band (i.e. a frequency band up to approximately the cut-off frequency of the soft mount). An increase in the transfer of vibrations may even occur in a frequency band around the cut-off frequency, e.g. due to resonance phenomena. Although the mirrors of the projection system may be able to follow these low frequency vibrations (e.g. by a suitable, stable design of the projection system and/or stabilization of one or more of the mirrors), movements of the projection system may still result in a deterioration of an accuracy of projecting the patterned beam on the substrate. This may be because such movements may result in focus errors, in displacement of the projected patterned beam onto the substrate, or other effects.

FIG. 2 further shows a control system, the control system configured to counteract a position error of the substrate table and the support relative to the projection system. The control system of the lithographic apparatus comprises a sensor SENS configured to provide a signal representative of a position related quantity of the projection system and a controller CON to which the signal of the sensor is provided. The control system is configured to drive a support actuator $ACT_M$ to exert a force on the support MT, and to drive a substrate table actuator $ACT_W$ to exert a force on the substrate table WT. From the signal of the sensor, the controller derives a support actuator adjustment drive signal to drive the support actuator and a substrate table adjustment drive signal to drive the substrate table. As the signal is representative of a position related quantity of the projection system, the controller may derive actuator adjustment drive signals therefrom which counteract a position error of the substrate table and a position error of the support relative to the projection system, by exerting via the respective actuator, a respective force on the substrate table and/or the support. Thus, the controller drives the support and/or substrate table actuator to compensate for a movement of the projection system, the movement of the projection system being e.g. relative to the reference, in this example the metrology frame.

The sensor SENS may provide a signal representing any position related quantity, such as a position of the projection system, a position of an element of the projection system, a velocity of the projection system or of an element of the projection system, an acceleration of the projection system or of an element of the projection system, etc. The sensor SENS may be located at any suitable position. The substrate table actuator may comprise a separate actuator to exert a force on the substrate table (e.g. electromagnetic, pneumatic, electrostatic, piezoelectric, or any other type of actuator) or may be comprised in an already existing actuator (e.g. positioner PW) to drive the substrate table, such as a short stroke motor and/or a long stroke motor. Likewise, the support actuator may comprise a separate actuator to exert a force on the substrate table (e.g. electromagnetic, pneumatic, electrostatic, piezoelectric, or any other type of actuator) or may be comprised in an already existing actuator (e.g. positioner PM) to drive the support, such as an existing, e.g. linear, motor.

Figure 3A:
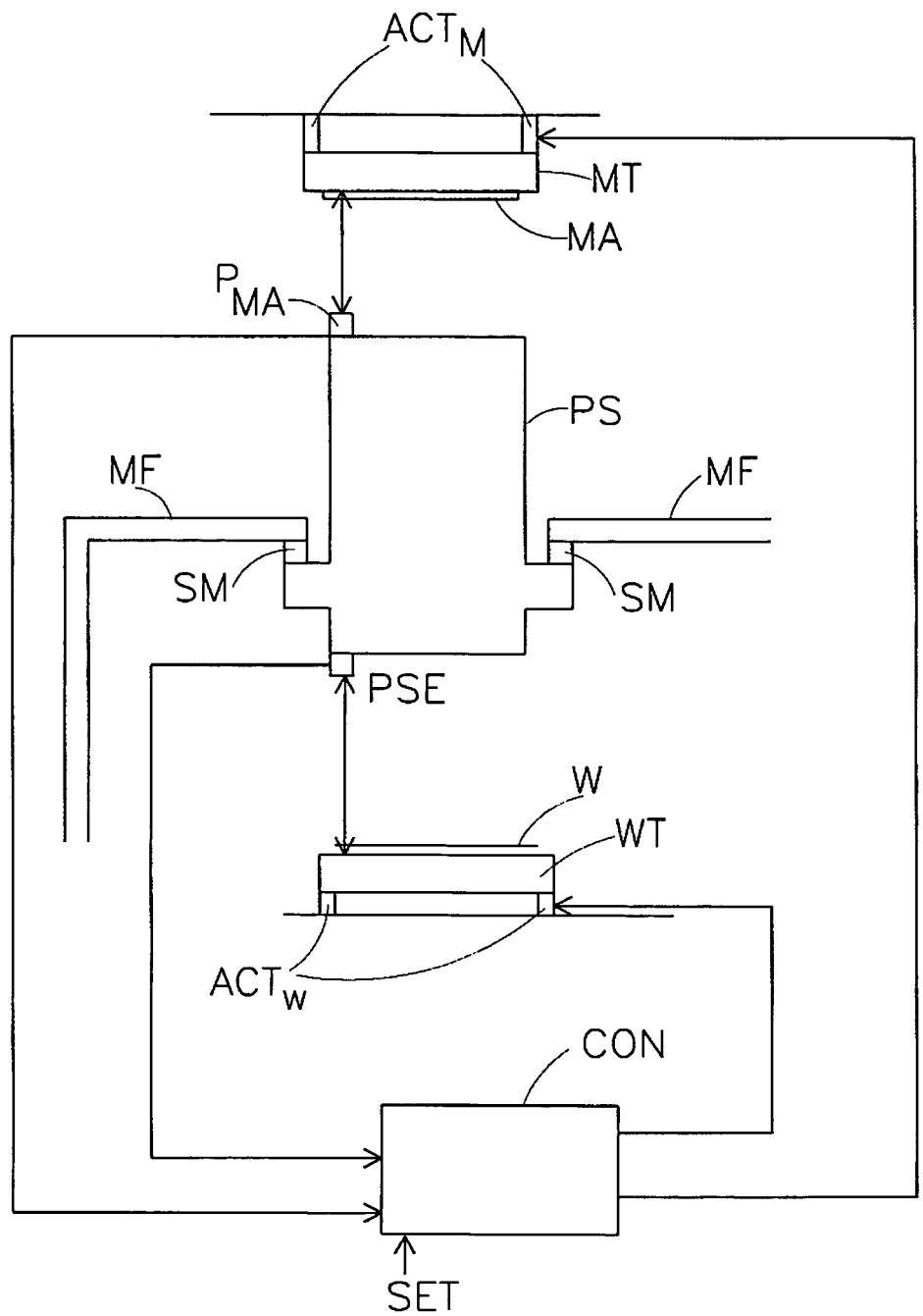
FIGS. 3A and B depict a schematic view of a part of a lithographic apparatus according to an embodiment of the invention.

In the embodiment depicted in FIG. 3A, the sensor comprises a support position sensor $P_{MA}$ to measure a position of the support relative to the projection system, as well as a substrate table position sensor PSE to measure a position of the substrate table relative to the projection system. Any suitable type of position sensor may be used. As an example, these position sensors may comprise an interferometer or an encoder, an encoder being preferred for cost reasons. Using an encoder, a grid or grating may be provided on the support and/or substrate table respectively, while a sensor head may be provided on the projection system, e.g. connected to a side of the projection system facing the support and/or to a side of the projection system facing the substrate table to allow a short optical path of the interferometer or encoder in question. By using a position sensor, a signal representative of a position of the support and/or the substrate table is provided, the position being relative to the position of the projection system, thereby providing a suitable position parameter to the controller, as the relative position indicates an extent to which the substrate table/support follows a movement of the projection system. Using the signals from the position sensor, e.g. a feedback control loop may be provided, as depicted in FIG. 3A, where the controller may be arranged to compare the measured position with a set point SET (i.e. a desired position of the support/substrate table relative to the projection system) and further being arranged to drive the actuator according to a detected difference between the measured relative position and the desired relative position.

Figure 3B:
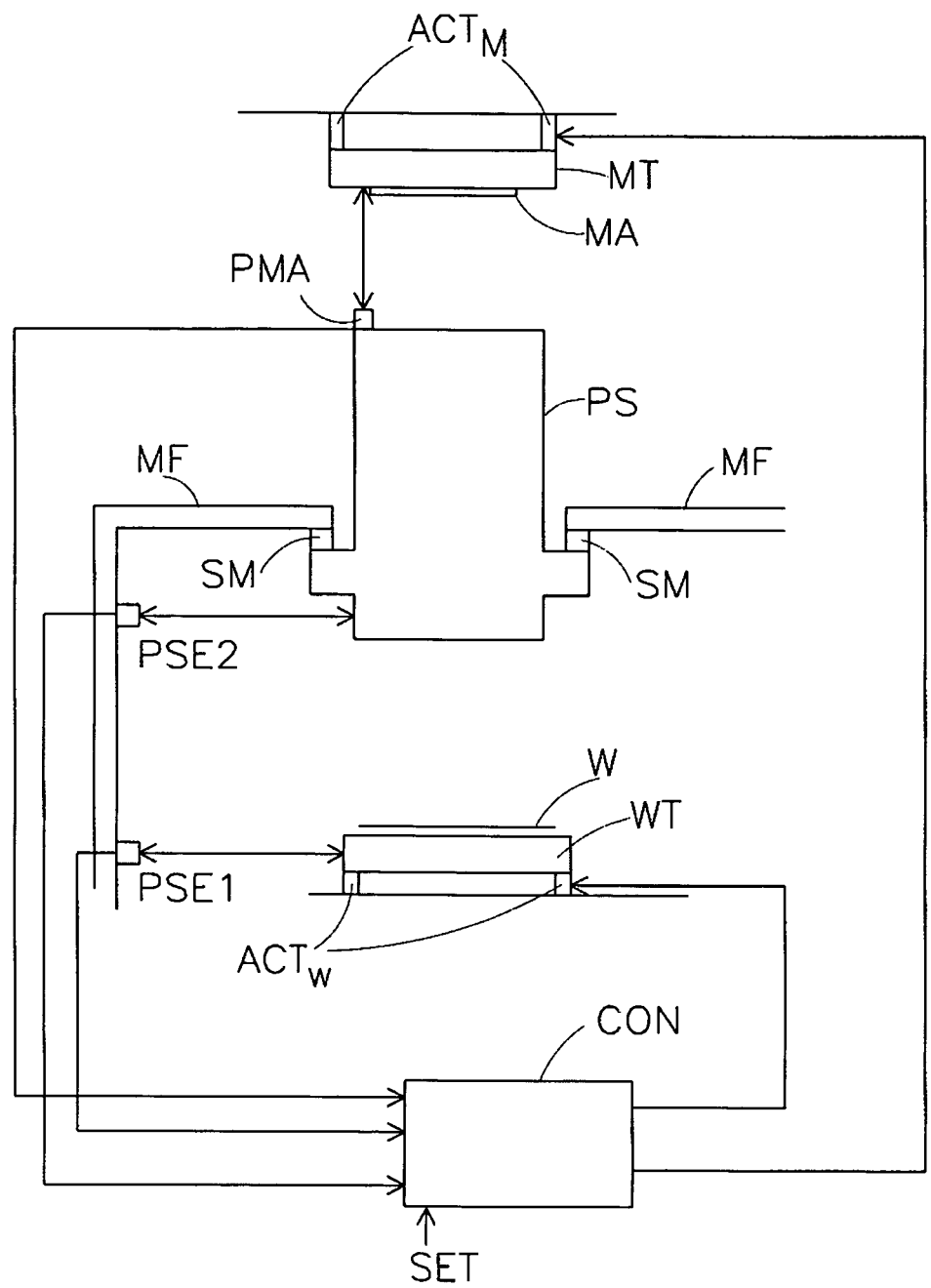

The substrate table position sensor may, as depicted in FIG. 3B, comprise a first position sensor PSE1 to measure a position of the substrate table relative to the reference frame and a second position sensor PSE2 to measure a position of the projection system relative to the reference frame. Thereby, use can be made of an already existing (large range of movement) position sensor to measure a position of the substrate table relative to, e.g., the metrology frame, reducing cost and complexity. The first (e.g. the already existing) position sensor may comprise an interferometer while the second position sensor may comprise an encoder, thereby forming a low cost addition of the encoder to the existing interferometer. A further or alternative advantage may be that the encoder may be placed on one side of a vacuum separation between a substrate stage compartment and a projection system compartment, while the interferometer may be placed on another side of the vacuum separation. Still further, the encoder may be aligned with respect to the projection system before mounting the projection system into the lithographic apparatus, which may considerably ease such alignment. The encoder may provide a 6 degrees of freedom position signal to allow (in combination with a 6 degrees of freedom position measurement by the interferometer) a 6 degrees of freedom measurement of the relative position of the substrate table with respect to the projection system, to thereby enable the controller to drive the substrate table actuator to allow the substrate table to follow the movements of the projection system at a high degree of freedom.

Position sensors PSE, PSE1 and/or PSE2 may be comprised in position sensor IF2, or may be a separate sensor or sensors. Likewise, position sensor PMA may be comprised in position sensor IF1 or may be formed by a separate sensor or sensors.

Figure 4:
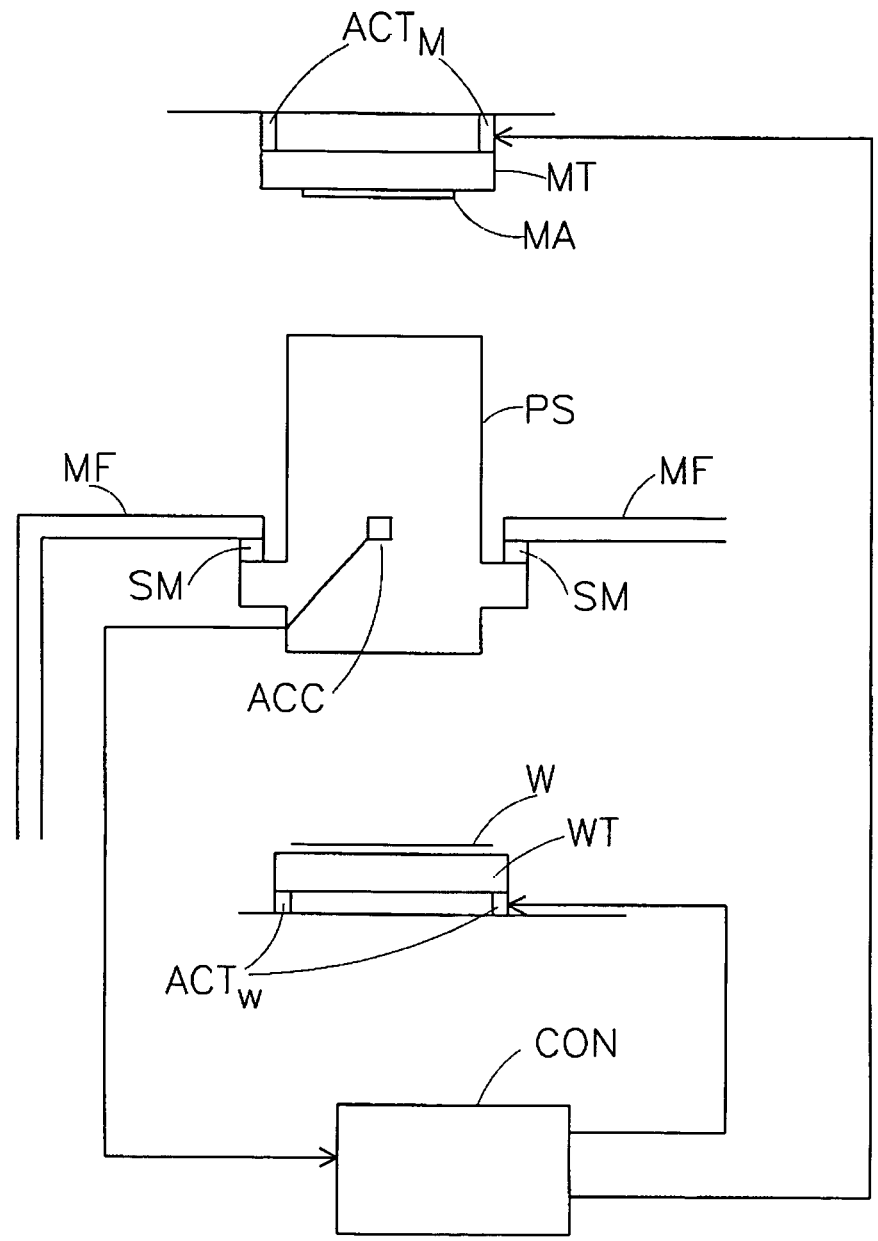
FIG. 4 depicts a schematic view of a part of a lithographic apparatus according to an embodiment of the invention.

In addition to or instead of the feedback configuration as described above with reference to FIG. 3A and/or 3B, it is also possible, as depicted with reference to FIG. 4, that a feed-forward is provided to forwardly feed a signal to the support actuator and/or the substrate table actuator. The feed-forward signal may, as shown in this example, be derived from an acceleration of the projection system, as measured by an acceleration sensor ACC. The acceleration as measured by the sensor provides a measure of a force on the projection system. The controller derives from the acceleration signal a signal to drive the substrate table actuator and/or the support actuator, the driving being in a feed-forward manner to at least partly compensate disturbance forces that cause the vibration as measured by the acceleration sensor. In this example, the projection system may be considered a rigid assembly, allowing for the controller to base the feed-forward for the substrate table as well as for the support on a same, single acceleration signal. Optionally, separate acceleration sensors could be provided. The projection system may commonly be considered a rigid assembly in the case that one or more stabilized projection mirrors are provided since the stabilization of the mirrors makes the mirrors follow vibrations of a projection system frame of the projection system, the frame holding the at least one mirror. The acceleration sensor may provide a six degrees of freedom acceleration signal (i.e. X, Y and Z as well as rotations with respect to these axes), to allow the substrate table and the support to follow the movements of the projection system in each of these degrees of freedom. The acceleration sensor may comprise a plurality of acceleration sensors (each, e.g., in a single degree of freedom and/or in two degrees of freedom) to provide the 6 degrees of freedom acceleration sensor.

In an embodiment, a maximum frequency of the feed-forward signal is substantially equal to or larger than a vibration reduction cut-off frequency of the soft mount to allow an effective damping at one or more possible resonance frequencies of the projection system. The term vibration reduction cut-off frequency is to be understood as a frequency below which a vibration reduction of the soft mount declines.

In an embodiment, a projection system position sensor may be provided to provide a projection system position signal representative of a position of the projection system relative to the reference element, the projection system position signal being provided to the controller and the controller arranged to drive a projection system actuator to reduce a movement of the projection system relative to the reference element. Thereby, an active damping of movements of the projection system may be provided, to relax the task of the controller described above. The projection system position sensor may provide a six degrees of freedom position signal to allow control in up to six degrees of freedom.

An advantage of the feed-forward is that it may allow a fast actuation of the substrate table actuator and/or the support actuator. However, the feedback as shown in and described with reference to FIG. 2 may provide an accurate actuation.

To provide both accuracy and speed, a combination of feed-forward and feedback is preferred, the controller thus being provided with an acceleration signal as well as with a position signal to provide the relative positions.

An embodiment of the invention comprises a device manufacturing method comprising projecting a patterned beam of radiation onto a substrate by a lithographic apparatus as described above, followed by developing the irradiated substrate and manufacturing a device from the developed substrate.

It is to be understood that the substrate table actuator and/or the support actuator may comprise one or more single dimensional actuators, one or more multi-dimensional actuators, and/or a plurality of single and/or multi dimensional actuators to form a multi-dimensional actuator.

The controller may comprise a digital controller and may be programmed in suitable software running on a programmable device such as a microcontroller, microcomputer, microprocessor of any other numeric device. Instead or in addition thereto, parts of the controller, or the controller in full, may be implemented in dedicated electronics, such as analog and/or digital electronic hardware.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a support constructed to support a patterning device, the patterning device being capable of imparting a radiation beam with a pattern in its cross-section to form a patterned radiation beam;
   a substrate table constructed to hold a substrate;
   a projection system configured to project the patterned radiation beam onto a target portion of the substrate, the projection system being mounted to a reference element of the lithographic apparatus by a resilient mount to reduce a transfer of high frequency vibration from the reference element to the projection system; and
   a control system to counteract a position error of the substrate table and the support relative to the projection system, wherein the control system comprises an acceleration sensor to provide an acceleration signal representative of an acceleration of the projection system and wherein the control system is configured to derive a support feed-forward signal and a substrate table feed-forward signal from the acceleration signal, the support feed-forward signal to be provided to a support actuator and the substrate table feed-forward signal to be provided to a substrate table actuator.

2. The lithographic apparatus according to claim 1, wherein the acceleration sensor is configured to provide a six degrees of freedom acceleration signal.

3. The lithographic apparatus according to claim 1, wherein a maximum frequency of the feed-forward signals is substantially equal to or larger than a vibration cut-off frequency of the resilient mount.

4. The lithographic apparatus according to claim 1, further comprising a projection system position sensor to provide a projection system position signal representative of a position of the projection system relative to the reference element and wherein the control system is configured to drive a projection system actuator to dampen a movement of the projection system relative to the reference element based on the projection system position signal.

5. The lithographic apparatus according to claim 1, wherein the projection system comprises a projection mirror.

6. The lithographic apparatus according to claim 5, wherein the projection mirror is stabilized relative to a projection system frame, the projection system frame holding the projection mirror.

7. The lithographic apparatus according to claim 6, wherein the projection mirror is stabilized to follow movements of the projection system via a feed-forward control.

8. A device manufacturing method, comprising:
   supporting a patterning device by a support, the patterning device being capable of imparting a radiation beam with a pattern in its cross-section to form a patterned radiation beam;
   holding a substrate by a substrate table;
   projecting the patterned radiation beam onto a target portion of the substrate using a projection system, the projection system mounted to a reference element by a resilient mount to reduce a transfer of high frequency vibration of the reference element to the projection system;
   determining an acceleration signal representative of an acceleration of the projection system;
   counteracting a position error of the substrate table and the support relative to the projection system by
      deriving a support feed-forward signal and a substrate table feed-forward signal from the acceleration signal;

providing the support feed-forward signal to the support actuator; and providing the substrate table feed-forward signal to the substrate table actuator;

developing the irradiated substrate; and manufacturing a device from the developed substrate.

9. The method according to claim 8, wherein the projection system comprises a projection mirror.

10. The method according to claim 9, wherein the projection mirror is stabilized relative to a projection system frame, the projection system frame holding the projection mirror.

11. The method according to claim 9, further comprising stabilizing the projection mirror to follow movements of the projection system via a feed-forward control.

* * * * *